United States Patent [19]

Honma et al.

[11] Patent Number: 5,748,436
[45] Date of Patent: May 5, 1998

[54] CERAMIC ELECTROSTATIC CHUCK AND METHOD

[75] Inventors: Junich Honma, Tokyo; Kotaro Mino, Himeji; Hisayuki Miyata, Ibo-gun; Haruhide Inoue, Himeji, all of Japan

[73] Assignee: Advanced Ceramics Corporation, Lakewood, Ohio

[21] Appl. No.: 785,082

[22] Filed: Jan. 21, 1997

Related U.S. Application Data

[63] Continuation-in-part of Ser. No. 725,130, Oct. 2, 1996.
[51] Int. Cl.⁶ .................................................. H02N 13/00
[52] U.S. Cl. .................................... 361/234; 279/128
[58] Field of Search .............................. 361/234; 279/128

[56] References Cited

U.S. PATENT DOCUMENTS 5,606,484  2/1997  Kawada et al. ...................... 361/234

*Primary Examiner*—Jeffrey A. Gaffin
*Assistant Examiner*—Thuy-Trang N. Huynh
*Attorney, Agent, or Firm*—Eugene Lieberstein; Michael N. Meller

[57] ABSTRACT

An electrostatic chuck and method for electrostatically clamping a working member such as a semiconductor wafer to the chuck. The elcetrostatic chuck includes at least one conductive electrode and an insulating layer for separating the conductive electrode from the working member. The insulating layer is composed of a composition containing pyrolytic boron nitiride (PBN) and a carbon dopant in an amount above 0 wt % and less than about 3 wt % such that its electrical resistivity is smaller than $10^{14}$ Ω-cm. A source of voltage is impressed across the conductive electrode to generate an electrostatic field which causes the working member to be clamped to the chuck.

10 Claims, 4 Drawing Sheets

CERAMIC ELECTROSTATIC CHUCK AND METHOD

FIELD OF INVENTION

This application is a continuation in part of U.S. patent application Ser. No. 08/725130 entitled Pyrolytic Boron Nitride Compact and Method Of Manufacture filed on Oct. 2, 1996 and more specifically relates to an electrostatic chuck particularly for use as a clamping device in the process of semiconductor wafer manufacture and to a method for manufacturing an electrostatic chuck.

BACKGROUND OF THE INVENTION

An electrostatic chuck is a clamping device which is principally used in the field of semiconductors to hold the semiconductor wafer clamped in a fixed position during semiconductor wafer manufacture. A clamping force is created by generating an electrostatic field which imparts an electrical charge upon a conductor in proximity to the wafer. The conductor is separated from the wafer by a dielectric material with the wafer disposed between a power source and the conductor in either a monopolar configuration in which the wafer serves also as an electrode or in a dipolar configuration. In either configuration the insulator separates the charged electrode(s).

One serious problem in prior art electrostatic chucks is the tendency to develop cracks between the insulating separator and a substrate for the conductor comprising the electrode and/or between the conductor and the insulator. This tendency to form cracks is believed to be attributable, at least in part, to the widely varying thermal expansion characteristics of the materials comprising the electrode and insulator. In most prior art designs metal is used as the electrode and the insulator is composed from sintered ceramic materials such as AlN, $Si_3N_4$ and BN. These insulating materials are commercially available and have electrical resistivites above $10^{14}$ $\Omega$-cm. It has been discovered in accordance with the present invention that the electrostatic attraction force or "chuck clamping force" may be substantially increased by limiting the resistivity of the insulator to a value smaller than $10^{14}$ $\Omega$-cm. Stated otherwise, a large supplementary clamping force may be generated if a currect of very low magnitude is permitted to pass through the insulative separator. This is known as the "Johnsen-Rahbek" effect. However, to generate a clamping force in this manner requires the resistivity of the insulator to be of a value smaller than $10^{14}$ $\Omega$-cm and preferably of a resistivity in a range of between $10^8$ $\Omega$-cm and $10^{13}$ $\Omega$-cm.

Prior art electrostatic chucks also inherently suffer from the need to wait a relatively long time, e.g., from several seconds to over 10 seconds, before the charge upon the wafer is dissipated to a level low enough for the wafer to be removed or to permit a new wafer to be substituted. In accordance with the present invention the insulative separator has a resistivity of between $10^8$ $\Omega$-cm and $10^{13}$ $\Omega$-cm which will permit the charge on the wafer to dissipate to a substantially low enough level for wafer removal in a time period equal to no more than 1.0 seconds and preferably below 0.5 seconds.

SUMMARY OF THE INVENTION

The electrostatic chuck of the present invention is designed to overcome all of the deficiencies of prior art electrostatic chucks and to exhibit a strong electrostatic clamping force even at elevated temperatures above 300° C.

An electrostatic chuck for electrostatically clamping a working member such as a semiconductor wafer to the chuck comprising: at least one conductive electrode, an insulating layer layer for separating said conductive layer from said working member with said insulating layer composed of a composition containing pyrolytic boron nitiride (PBN) and a carbon dopant in an amount less than about 3 wt % such that its elctrical resistivity is smaller than $10^{14}$ $\Omega$-cm; and a source of voltage for generating an electrostatic field adjacent said working member so as to clamp said working member to said chuck.

The method of manufacturing an electrostatic chuck for clamping a working member to the chuck in accordance with the present invention comprises the steps of:

depositing a layer of pyrolytic boron nitride over the body of a graphite substrate having opposite sides;

depositing a conductive composition of pyrolytic graphite to symmetrically cover said layer of pyrolytic boron nitride on each side of said substrate;

separating said conductive composition on one side of said graphite substrate into a first and second conductive layer;

surrounding said conductive composition and said first and second conductive layers with a pyrolytic boron nitride composition doped with carbon in an amount not exceeding 3 wt % of the pyrolytic boron nitride composition;

arranging said working member over said doped layer of pyrolytic boron nitride;

applying a voltage across said first and second conductive layers in proximity to said working member so as to generate an electrostatic field for clamping said working member to said chuck.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figure 1:
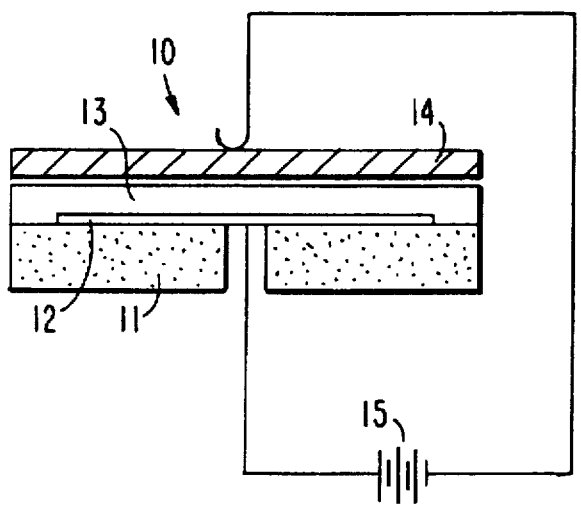
FIG. 1 is a prior art monopolar electrostatic chuck shown in cross section.

The basic arrangement of a prior art monopolar electrostatic chuck is shown in cross section in FIG. 1. A prior art electrostatic chuck having a bipolar configuration is shown in cross section in FIG. 2. The monopolar arrangement of FIG. 1 includes a conductive electrode 12 disposed between an insulating body 11 and an insulating layer 13. The insulating layer 13 may be of the same composition as the insulating body 11 and is preferably composed of a ferroelectric sintered ceramic. The semiconductor wafer 14 which is to be clamped to the chuck 10 is placed over and in contact with the insulating film 13. A voltage source 15 is connected to the semiconductor wafer 14 and to the conductive electrode 12 for creating an electrostatic field. The electrostatic field causes the wafer 14 and the electrode 12 to be oppositely charged thereby establishing an electrostatic attraction force for clamping the wafer 14 to the chuck 10. In the monopolar configuration the wafer 14 is electrically connected in circuit with the power source 15. The clamping force is proportional to the magnitude of the impressed voltage. However, the impressed voltage cannot be raised above the break down voltage of the dielectric material.

Figure 2:
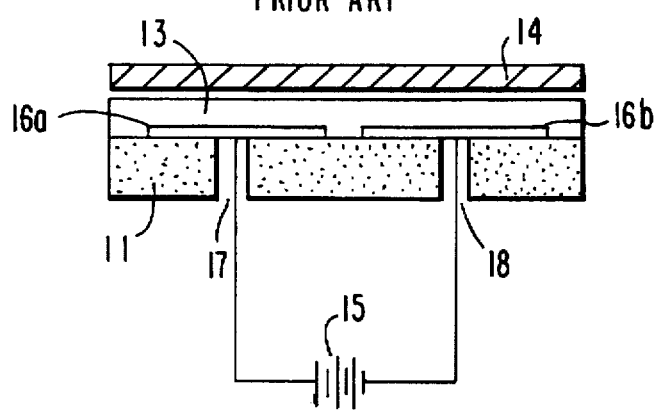
FIG. 2 is a prior art bipolar electrostatic chuck shown in cross section.

The bipolar arrangement of FIG. 2 includes a pair of conductive electrodes 16a and 16b spaced apart in close proximity to one another and preferably in horizontal alignment. The conductive electrodes 16a and 16b are located between the insulating body 11 and the insulating layer 13 in an otherwise similar arrangement to the embodiment of FIG. 1 with the insulating film 13 deposited over the conductive electrodes 16a and 16b and the semiconductor wafer 14 placed over the insulating film 13. In this configuration the voltage source 15 is connected to each of the conductive electrodes 16a and 16b through the spaces 17 and 18 formed in the insulating body 11 to provide access to each of the electrodes 16a and 16b respectively. The impressed volatage from the power source 15 generates an electrostatic field and causes the electrodes 16a and 16b to become oppositely charged. Since the wafer 14 is in close proximity to the electrodes 16a and 16b and is within the generated electrostatic field an electrical charge is buit up causing the wafer 14 to become clamped to the chuck 10.

In the prior art arrangement of FIG. 1 and 2 the insulating layer 13 has so high a resistivity that current is essentially prohibited from passing therethrough. Accordingly no "Johnsen-Rahbek" supplementary clamping force can be generated. Moreover, since the chuck must dissipate the electrical charge built up upon the wafer 14 before the wafer 14 can be removed from the chuck a long time period was heretofore necessary before the wafer could be removed without damage.

Figure 3:
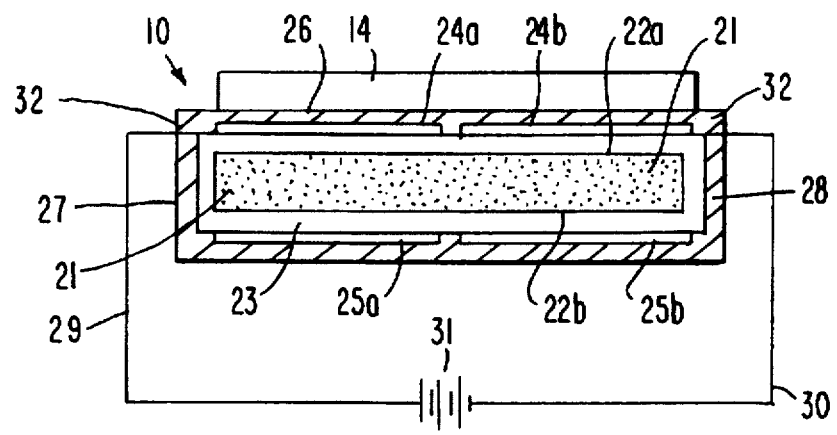
FIG. 3 is a cross sectional view of a preferred embodiment of the electrostatic chuck of the present invention.

The electrostatic chuck 10 of the present invention, as shown in FIG. 3, comprises a graphite body 21 having a generally rectangular configuration with opposite sides 22a and 22b. The graphite body 21 functions as a substrate upon which a layer 23 of pyrolytic boron nitride is coated by chemical vapor deposition such as by means of a vapor phase reaction between a boron halide and ammonia as is taught in U.S. Pat. No. 3,152,006 the disclosure of which is herein incorporated by reference. Two electrodes 24a and 24b are superimposed upon the layer 23 on one of sides 22a of the graphite body 21. The electrodes 24a and 24b are preferably formed as a single deposit by chemical vapor deposition and separated by either a masking or etching step to form the two distinct electrode layers 24a and 24b respectively.

The electrodes 24a and 24b are preferably composed of pyrolytic graphite and should be spaced closely apart. Pyrolytic graphite is essentially highly oriented polycrystalline graphite produced by high temperature pyrolysis of a hydrocarbon gas such as methane, ethane, ethylene, natural gas, acetylene and propane. Although the pyrolytic graphite electrodes 24a and 24b need only be formed on the one side 22a of the graphite substrate 21 it is preferred to form symmetrical complementary pyrolytic graphite layers 25a and 25b on the opposite side 22b of the graphite substrate 21 to balance residual stress from both sides of the substrate 21. The PG layer 25 may also be used as a heating element for heating the wafer 14 on the electrostatic chuck 10.

A coating 26 of a pyrolytic boron nitride (PBN) composition containing carbon in an amount not exceeeding 3 wt % of the PBN composition is then formed surrounding the pyrolytic graphite layers and enclosing the chuck 10 on all sides thereof. An opening 32 is formed in the doped PBN coating 26 through each opposite end 27 and 28 of the chuck 10 to permit the conductive leads 29 and 30 of the power source 31 to be connected to the conductive electrodes 24a and 24b. The surface area of each of the adjacent PG electrodes 24a and 24b should substantially match the surface area of the complementary PG conductive layers 25a and 25b. This symmetrical arrangement of the conductors 24 and 25 is believed to reduce any tendency toward warping or deformation based upon differences in the thermal expansion coefficients of the insulator layer 23 and each of the conductors 24a, 24b, 25a and 25b respectively.

The doped PBN coating 26 is formed by the codeposition of PBN and pyrolytic graphite (PG) preferably by introducing a hydrocarbon gas such as, for example, methane into the reactor furnace during the deposition of pyrolytic boron nitride as is taught in the parent U.S. patent application Ser. No. 08/725130. When PBN is codeposited with pyrolytic graphite (PG) the PBN is deposited at nearly the same rate as compared to a pure PBN deposit. The rate of carbon codeposition is smaller by a factor $\geq 20$ than for a pure deposit because ammonia removes deposited carbon as HCN. The presence of carbon in the PBN composition causes the electrical resistivity of the codeposit to vary as a function of the mole fraction of carbon in the codeposit up to a mole fraction for carbon of about 0.06 which corresponds to a carbon concentration of about 3 wt %. Accordingly, the electrical resistivity of the doped PBN layer 26 can be adjusted to a value smaller than $10^{14}$ $\Omega$-cm and preferably between $10^8$ $\Omega$-cm and $10^{13}$ $\Omega$-cm by adjusting the carbon concentration in the codeposit to a level from above zero "0" wt % carbon to 3 wt %. The working member 14 may represent a semiconductor wafer and is situated on top of and in contact with the doped PBN layer 26 as illustrated FIG. 3.

Figure 5:
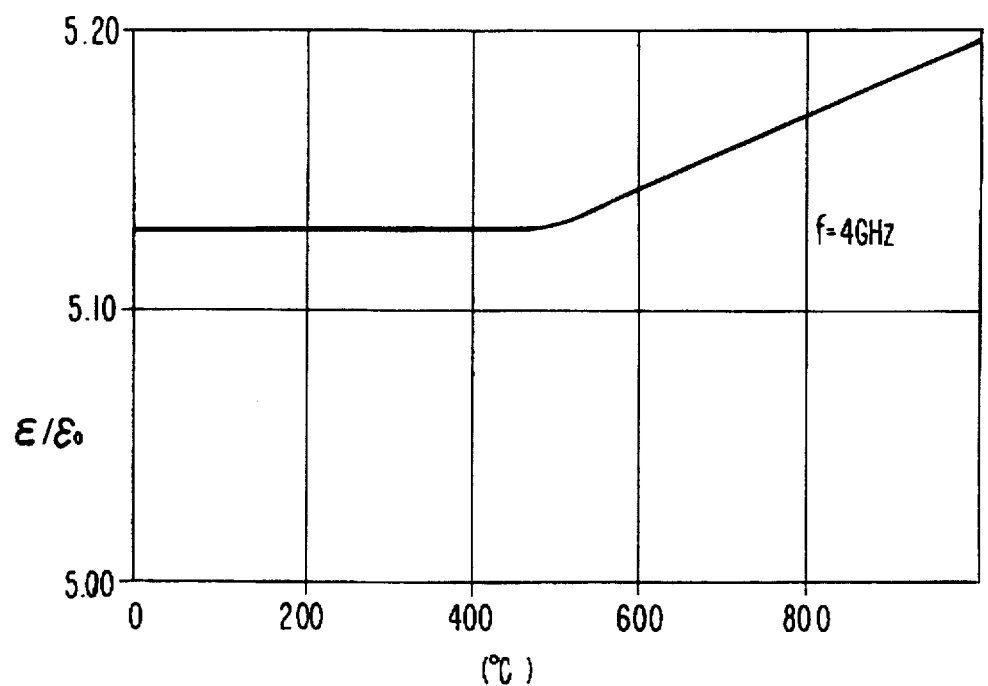
FIG. 5 is a diagram showing the relationship between temperature and dielectric constant for the doped PBN layer in the embodiment of FIG. 3.

For comparison two electrostatic chucks were formed using sample substrates of graphite with the same structure. On one substrate a carbon doped PBN coating was formed in a reaction chamber by introducing 3 moles of ammonia and 2.4 moles of methane gas to one mole of boron trichloride and caused to react at a pressure of 0.5 Torr and at a temperatrure of 1850° C. to form a PBN doped film on the substrate having a thickness of 100 µm. The electrical resistivity of this film was measured and found to be $2.8 \times 10^{12}$ $\Omega$-cm. The dielectric constant of this film layer varied nearly uniformly with temperature up to the vincinity of 500° C. and at temperatures greater than 500° C. the dielectric constant increased as shown in FIG. 5. These measurements appear to substantiate the lack of a Curie point in the carbon doped PBN layer.

A similar film coating of PBN without carbon was formed on the other graphite substrate by reacting 3 moles of ammonia to one mole of boron trichloride in a reaction chamber at a pressure of 0.5 Torr and at a temperatrure of 1850° C. to a thickness of 100 µm. The electrical resistivity of this film was measured and found to be $4.5 \times 10^{15}$ $\Omega$-cm.

Figure 4:
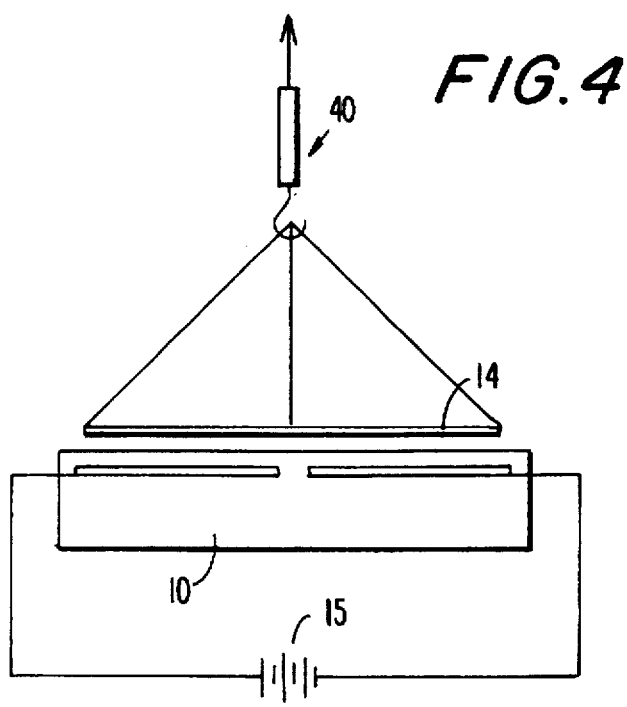
FIG. 4 is a diagrammatic showing of the method employed to measure the electrostatic clamping force developed by the electrostatic chuck of FIG. 3.
Figure 6:
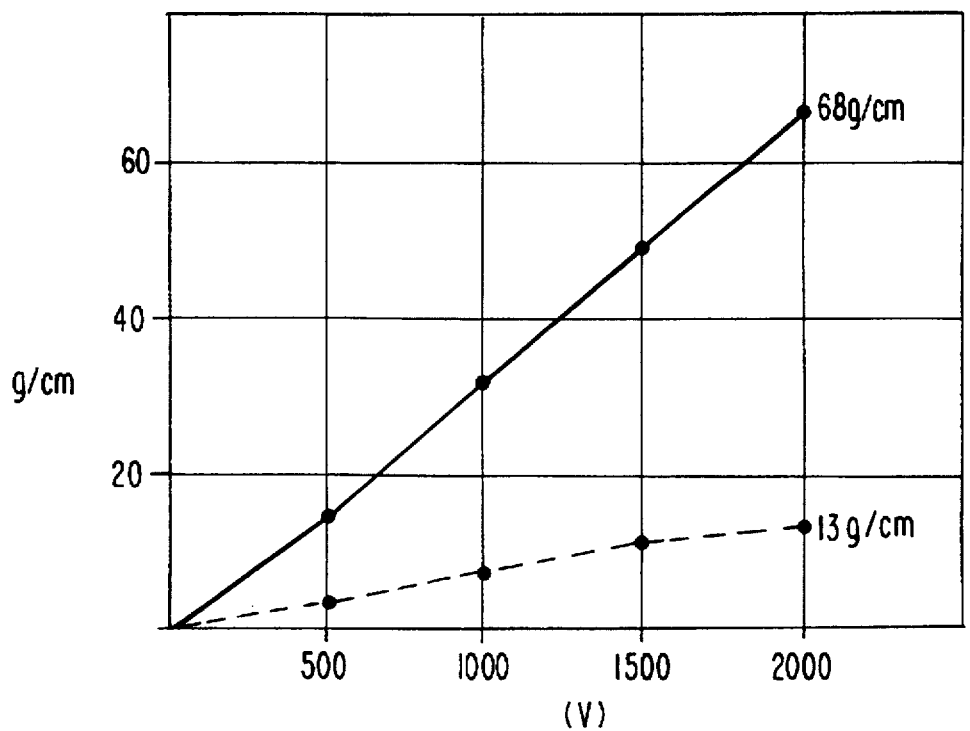
FIG. 6 is a diagram showing the relationship between electrostatic clamping force and impressed voltage for the embodiment of FIG. 3.

A comparison of the measured clamping force relative to impressed voltage for two otherwise identical electrostatic chucks having the configuration of FIG. 3 are shown in FIG. 6. The curves differ only by the PBN coatings as formed above with the solid curve having the lower electrical resistivity characteristic of $2.8 \times 10^{12}$ $\Omega$-cm and the dotted curve having the higher electrical resistivity of $4.5 \times 10^{15}$ $\Omega$-cm. The measurements were made using the set up shown in FIG. 4 with a device 40 such as a spring or instrom instrument used to measure the clamping force upon a suspended wafer 14 placed in contact with the electrostatic chuck 10 at different voltage settings between DC500V and DC2000V. As an example the clamping force per adsorption area 1 cm$^2$ was calculated taking the value displayed on the spring balance 40 when the wafer was separated from the chuck 10.

Figure 7:
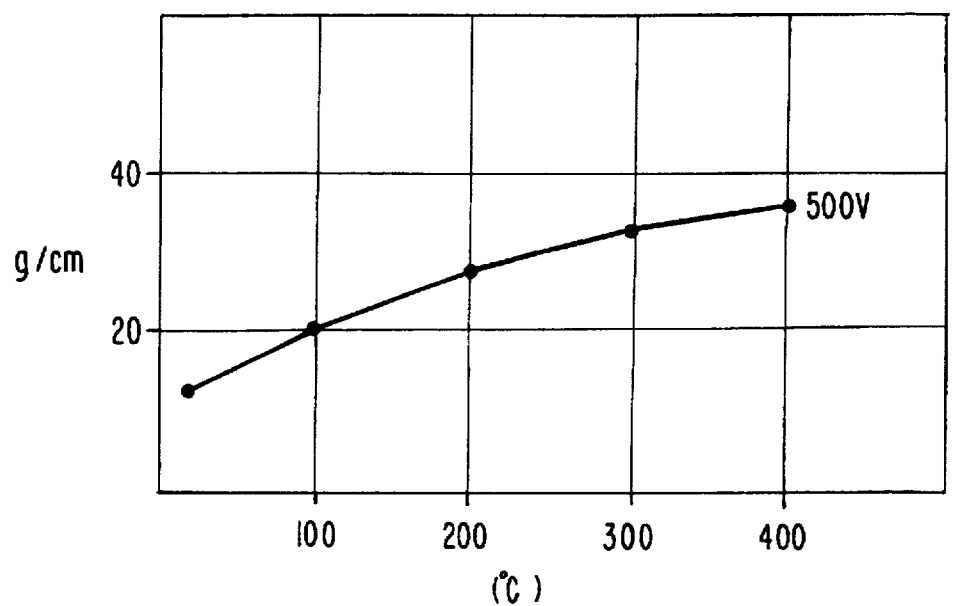
FIG. 7 is a diagram showing the relationship between electrostatic clamping force and temperature for the embodiment of FIG. 3.

The results shown in FIG. 6 demonstrate that the electrostatic adsorption force increased substantially for the electrostatic chuck in the working example having a carbon doped PBN film coating as compared to the otherwise identical electrostatic chuck in the working example in which the PBN film coating is not carbon doped. Moreover, as shown in FIG. 7 for the elcetrostatic chuck of the present invention the adsorbtion force is stabilized even in the high temperature zone of greater than 300° C. presumably since the Curie point does not exist in the carbon doped PBN film coating. Another advantage of the electrostatic chuck of the present invention using a carbon doped PBN film coating is the ability to remove the wafer from the chuck in than 2 seconds after turning off the impressed voltage. At present one must wait from several seconds to about 10 seconds before the wafer can be removed.

What we claim is:

1. An electrostatic chuck for electrostatically clamping a working member such as a semiconductor wafer to the chuck comprising: at least one conductive electrode, an insulating layer for separating said conductive electrode from said working member with said insulating layer composed of a composition containing pyrolytic boron nitiride (PBN) and a carbon dopant in an amount above 0 wt % and less than about 3 wt % such that its electrical resistivity is smaller than $10^{14}$ $\Omega$-cm; and a source of voltage for generating an electrostatic field adjacent said working member so as to clamp said working member to said chuck.

2. An electrostatic chuck as defined in claim 1 arranged to form a unipolar configuration with said source of voltage impressed between said conductive electrode and said working member.

3. An electrostatic chuck as defined in claim 1 further comprising a second conductive electrode with said source of voltage impressed between said one conductive electrode and said second conductive electrode to form a bipolar configuration.

4. An electrostatic chuck as defined in claim 3 wherein said first and second electrode is composed of pyrolytic graphite.

5. An electrostatic chuck as defined in claim 4 fiurther comprising an insulating body for forming a substrate for said one conductive electrode and said second conductive electrode.

6. An electrostatic chuck for electrostatically clamping a working member such as a semiconductor wafer to the chuck comprising: a graphite substrate; a first conductive electrode and a second conductive electrode spaced in close proximity to said first conductive elcetrode, a first insulating layer for separating said graphite substrate from said first and second conductive electrodes, a second insulating layer for separating each of said said conductive electrodes from said working member with said second insulating layer composed of a composition containing pyrolytic boron nitiride (PBN) and a carbon dopant in an amount less than about 3 wt %; and means for imposing a voltage across said first and second conductive electrodes so as to generate an electrostatic field adjacent said working member for clamping said working member to said chuck.

7. An electrostatic chuck as defined in claim 6 wherein said graphite substrate has at least two opposing sides with said first and second conductive electrodes located on one common side of said graphite substrate and further comprising a complementary third and fourth conductive electrode disposed on an opposing side of said graphite substrate.

8. An electrostatic chuck as defined in claim 7 wherein said first and second electrode is composed of pyrolytic graphite.

9. An electrostatic chuck as defined in claim 8 wherein said second insulating layer covers each of said first, second, third and fourth electrodes.

10. A method of manufacturing an electrostatic chuck for clamping a working member to the chuck comprising the steps of:

depositing a layer of pyrolytic boron nitride over the body of a graphite substrate having opposite sides;

depositing a conductive composition of pyrolytic graphite to symmetrically cover said layer of pyrolytic boron nitride on each side of said substrate;

separating said conductive composition on one side of said graphite substrate into a first and second conductive layer;

surrounding said conductive composition and said first and second conductive layers with a pyrolytic boron nitride composition doped with carbon in an amount not exceeding 3 wt % of the pyrolytic boron nitride composition;

arranging said working member over said doped layer of pyrolytic boron nitride;

applying a voltage across said first and second conductive layers in proximity to said working member so as to generate an electrostatic field for clamping said working member to said chuck.

* * * * *